United States Patent [19]

Ishikawa

[11] Patent Number: 4,638,247
[45] Date of Patent: Jan. 20, 1987

[54] INTEGRATED CIRCUIT FOR CONVERTING A DRIVE SIGNAL OF THREE OR MORE VOLTAGE LEVELS TO TWO VOLTAGE LEVELS

[75] Inventor: Takehiro Ishikawa, Tokyo, Japan

[73] Assignee: Kabushiki Kaisha Daini Seikosha, Tokyo, Japan

[21] Appl. No.: 418,269

[22] Filed: Sep. 15, 1982

[30] Foreign Application Priority Data

Sep. 16, 1981 [JP] Japan .................. 56-145887

[51] Int. Cl.⁴ ........................................... G01R 15/12
[52] U.S. Cl. ............................................. 324/73 R
[58] Field of Search .............. 324/51, 56, 426, 115, 324/133, 141, 73 R, 73 PC, 435–437; 340/715, 805, 784; 368/82, 84, 87, 156, 155; 350/331 R, 332

[56] References Cited

U.S. PATENT DOCUMENTS

| | | | |
|---|---|---|---|
| 2,731,491 | 1/1956 | Jeannot | 324/73 R |
| 3,038,121 | 6/1962 | Gray et al. | 324/157 |
| 3,866,171 | 2/1975 | Loshbough | 340/715 X |
| 3,895,372 | 7/1975 | Kaji et al. | 340/784 |
| 4,282,594 | 8/1981 | Ichikawa | 340/715 X |
| 4,307,392 | 12/1981 | Loshbough | 340/715 |
| 4,423,929 | 1/1984 | Gomi | 350/335 |

FOREIGN PATENT DOCUMENTS

| | | | |
|---|---|---|---|
| 3125132 | 1/1983 | Fed. Rep. of Germany | 340/715 |
| 0116217 | 9/1980 | Japan | 340/715 |

Primary Examiner—Reinhard J. Eisenzopf
Assistant Examiner—Warren S. Edmonds
Attorney, Agent, or Firm—Robert E. Burns; Emmanuel J. Lobato; Bruce L. Adams

[57] ABSTRACT

An integrated circuit is operable to produce a first signal of at least three voltage levels at an output terminal thereof for driving a liquid crystal during a normal mode of operation and is operable to change the first signal to a second signal of two voltage levels for use in testing the first signal during a test mode of operation. The integrated circuit comprises a logic circuit for generating a reference signal and an effective signal to control the driving of the liquid crystal, test circuitry for producing a test signal during the test mode, a drive control circuit receptive of the reference signal and the effective signal for producing normal drive control signals in the absence of the test signal and for producing test drive control signals in response to the test signal, and a set of analogue switches responsive to the drive control signals for producing the first signal of at least three voltage levels when the test circuitry does not produce the test signal and for producing the second signal of two voltage levels when the test circuitry produces the test signal. During the test mode, the second signal of two voltage levels is applied to a conventional LSI tester incorporated in the LSI circuitry which includes the integrated circuit, and the LSI tester utilizes the two voltage levels of the second signal to test the operational state of the LSI circuitry.

2 Claims, 5 Drawing Figures

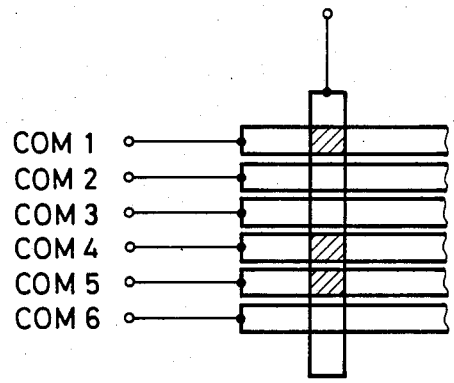
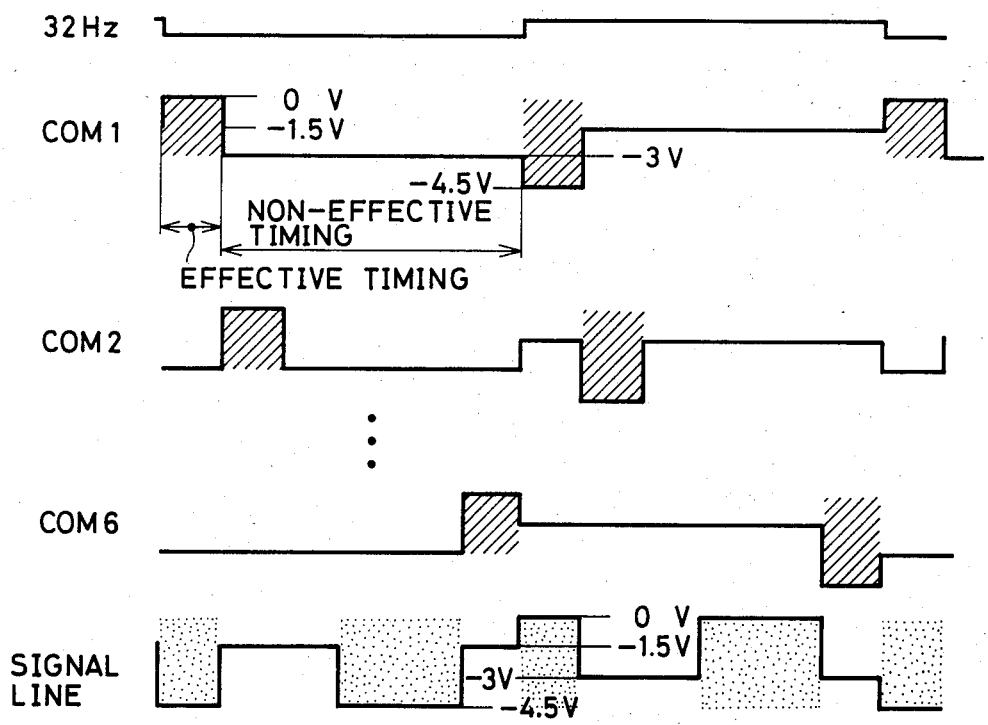

INTEGRATED CIRCUIT FOR CONVERTING A DRIVE SIGNAL OF THREE OR MORE VOLTAGE LEVELS TO TWO VOLTAGE LEVELS

BACKGROUND OF THE INVENTION

The present invention relates to a test circuit for a watch integrated circuit which drives a liquid crystal in a multiplex mode.

Conventionally, an integrated circuit for driving a liquid crystal in a multiplex mode produces at least three voltage values at predetermined timings to drive the liquid crystal divisionally.

FIG. 1 shows a display pattern diagram of a liquid crystal dot matrix display, in which common electrodes (COM1-COM6) are arranged in the lateral direction, and signal lines are arranged in the longitudinal direction. Cross points of the lateral and longitudinal signal lines are driven time-divisionally in response to drive-timings of the common electrodes.

FIG. 2 shows a waveform chart of a multiplex drive mode in FIG. 1.

In a multi-divisional drive (six division in the case of FIG. 1), generally, at least three voltage values are applied to the liquid crystal alternately at preselected drive timings to drive the common electrodes. Namely, since plural display picture elements should be controlled by one signal line, voltages such as 0 V, −1.5 V, −3 V and −4.5 V should be applied to show the contrast of the liquid crystal vividly and to eliminate cross talk. An example of the drive waveform to realize the display condition in FIG. 1 is shown in FIG. 2, in which the voltage level at the drive timing indicated by the oblique line hatching is the effective drive level of the common electrodes, and the voltage level at the drive timing indicated by the dotted hatching is the effective drive level of the signal lines.

The phrase "effective drive level" means the level which satisfies the condition to illuminate (darken) the liquid crystal. The effective drive levels of the common electrodes are produced in turn in accordance with the drive timings of the electrodes COM1-COM6 as shown in FIG. 2.

The signal lines take the largest potential difference level (−4.5 V in FIG. 2) relative to the electrodes COM in case the liquid crystal is turned on and illuminated, while they take the smallest potential difference (−1.5 V in FIG. 2) in case the liquid crystal is turned off.

When the logical test (level "1" or "0") of the watch integrated circuit to turn on or off the liquid crystal is carried out to display the liquid crystal in a dot matrix mode, the test terminals of the LSI tester are switched ON and an output from the integrated circuit is judged by the LSI tester. As known in the art, the term "LSI tester" refers to test circuitry incorporated in the integrated circuit by the LSI maker for use in testing the operation of the integrated circuit.

FIG. 4 shows an embodiment of a watch integrated circuit in conjunction with an LSI tester. Reference numeral 41 denotes a comparator which comprises the LSI tester, and 42 denotes a watch integrated circuit. The output from the watch integrated circuit, i.e., the outputs from the common electrodes COM1-COM6, is judged by the comparator 41 of the LSI tester. Since the LSI tester presently used is for testing the logical circuit, the judging level is "1" or "0". Namely, the tester judges the level "1" if the voltage is less than −4.3 V.

In the testing method illustrated above, however, the LSI tester cannot judge the logical level when the voltage levels are −1.5 V and −3 V.

SUMMARY OF THE INVENTION

The object of this invention is to provide a test circuit for a watch integrated circuit capable of producing at least three values of output voltages and driving a liquid crystal display in a multiplex mode by any one of at least three values of voltage in response to the drive timings wherein, in the logical test condition, at least three values of output voltages for driving a liquid crystal display are changed to two voltage value levels to facilitate the carrying out of the logical test of the watch integrated circuit.

Another object of this invention is to provide a test circuit for a watch integrated circuit capable of testing in a conventional LSI tester which judges the level "1" if the test voltage is more than a first voltage level and judges the level "0" if the test voltage is less than a second voltage level.

BRIEF EXPLANATION OF THE DRAWINGS

FIG. 1 is a display pattern diagram of a liquid crystal dot matrix display of conventional construction, FIG. 2 is a waveform chart of a multiplex drive mode for driving the display of FIG. 1.

DESCRIPTION OF THE PREFERRED EMBODIMENT

Figure 3:
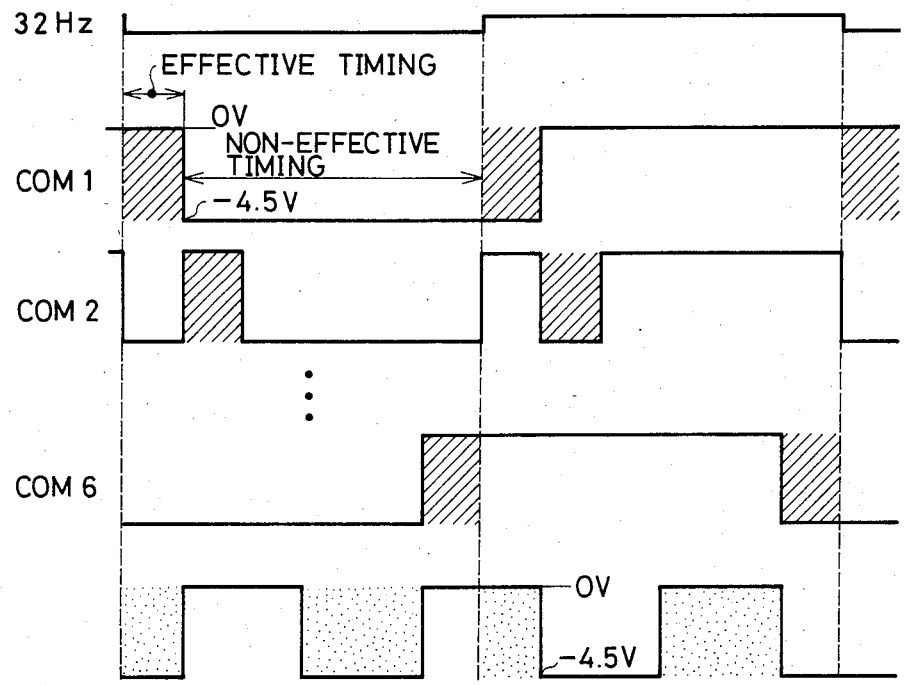
FIG. 3 is an output waveform chart of a test condition according to the present invention.

The logical test is carried out by the output waveform shown in FIG. 3 in testing the integrated circuit, while for the normal multiplex drive the output waveform shown in FIG. 2 is produced.

As shown in FIG. 3, when the 32 Hz signal is at "0" level, −4.5 V is produced in the case of the non-effective waveform (as compared to −3 V in FIG. 2), while when the 32 Hz signal is at "1" level, 0 V is produced in the case of the non-effective waveform (as compared to −1.5 V in FIG. 2).

Namely −3 V and −1.5 V are respectively changed to −4.5 V and 0 V so that only two voltage values 0 V and −4.5 V are always produced for the logical test. In other words, the output of the electrode COM1 shown in FIG. 2 (which represents the waveform of the normal mode of operation of the watch logical circuit) is converted into the output shown in FIG. 3 (which represents the waveform of the test mode of operation of the watch logical circuit) during testing of the circuit.

Figure 5:
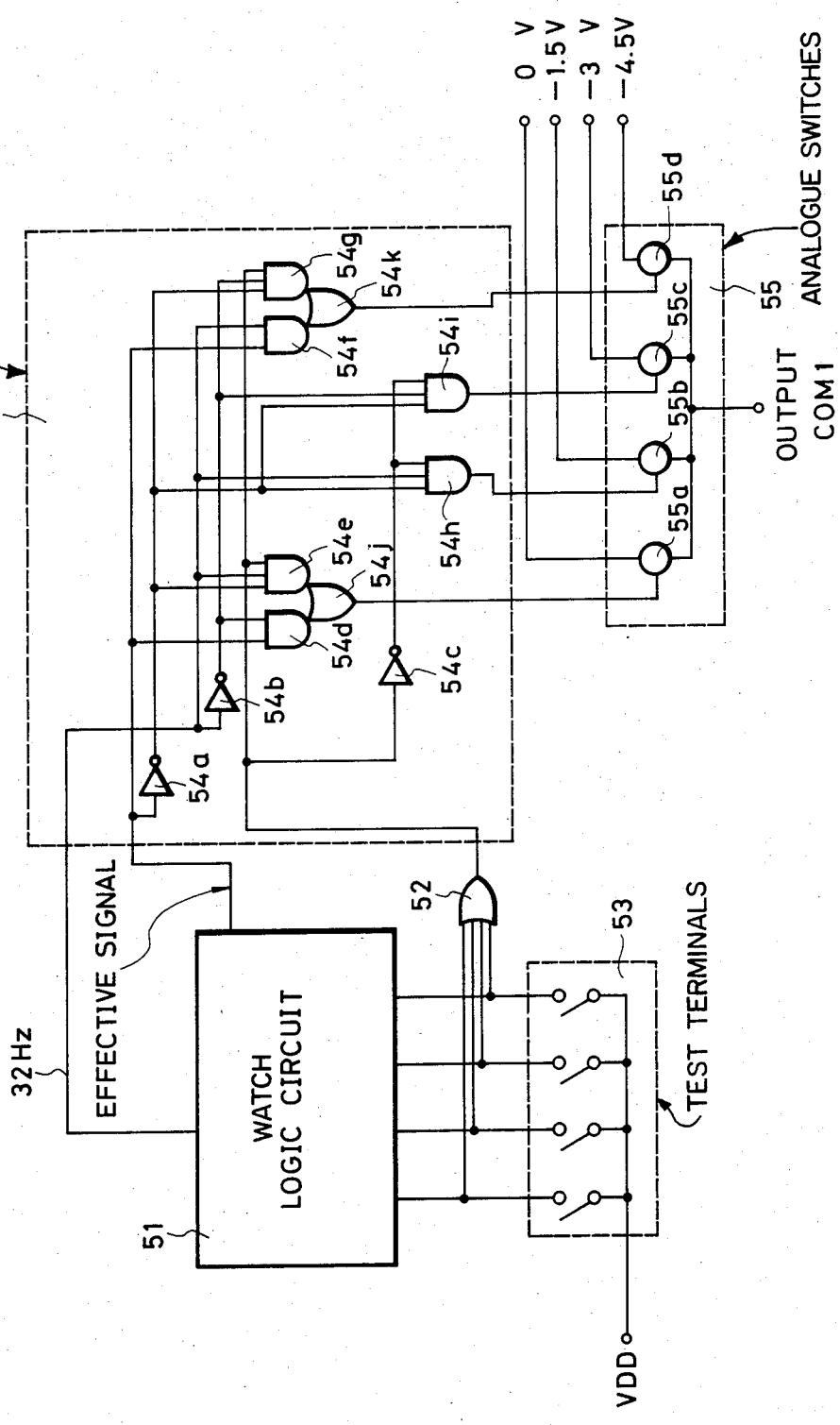
FIG. 5 is a circuit diagram of an embodiment of circuitry according to the present invention.

An embodiment of the present invention will be illustrated in conjunction with FIG. 5 which shows a watch logical circuit 51, an OR circuit 52, test terminals 53, a drive control circuit 54, and analogue switches 55. Reference numerals 54a-54c are inverters, 54d-54i are AND circuits, and 54j-54k are OR circuits.

A 32 Hz signal produced from the watch logical circuit 51 is applied to input terminals of the inverter 54b and the AND circuits 54e, 54h and 54f. An output signal from the inverter 54b is fed to input terminals of the AND circuits 54d, 54i and 54g.

An effective signal (level "1" at the effective time) for distinguishing between the effective waveform and the non-effective waveform is produced from the watch logical circuit 51, and the effective signal comprises a pulse timing signal having a pulse width corresponding to the oblique line hatching in FIGS. 2 and 3. The effective signal is applied to input terminals of the inverter 54a and the AND circuits 54d and 54f. An output signal from the inverter 54a is fed to input terminals of the AND circuits 54e, 54h, 54i and 54g.

The test terminals 53 are connected to each input terminal of the watch logical circuit 51 and the OR circuit 52, and an output signal from the OR circuit 52 is applied to input terminals of the inverter 54c and the AND circuits 54e and 54g.

An output signal from the inverter 54c is fed to input terminals of the AND circuits 54h and 54i.

The output signals from the AND circuits 54d and 54e are applied to an input terminal of the OR circuit 54j, and the output signals from the AND circuits 54f and 54g are applied to an input terminal of the OR circuit 54k.

Outputs from the OR circuit 54j, the AND circuits 54h and 54i and the OR circuit 54k are fed respectively to control input terminals of analogue switches 55a, 55b, 55c and 55d.

One terminal of each of the analogue switches 55a, 55b, 55c and 55d are respectively connected to 0 V, −1.5 V, −3 V and −4.5 V sources. These analogue switches 55a–55d are closed in response to the timing of the signal. Other ones of the terminals of the analogue switches 55a–55d are commonly connected to an output terminal COM1.

The operation of the present invention will now be described. In the normal operating state, the switches of the test terminals 53 are OFF. At this time an output from the OR circuit 52 is at "0" level and outputs from AND circuits 54e and 54g are at "0" level.

The circuit in FIG. 5 is for obtaining the waveforms of the common electrode COM1 shown in FIGS. 2 and 3, in which the timing to produce the effective signal at "1" level is the timing region indicated by the oblique line hatching on the COM1 waveform in FIG. 2.

At the effective timing of the 32 Hz signal at "0" level, the outputs from the AND circuit 54d and the OR circuit 54j are at "1" level and thus the analogue switch 55a is closed. Then the outputs from the AND circuit 54d and the OR circuit 54j become 0 V. Since the output from the inverter 54a is at "0" level, the output from the electrode terminal COM1 is also at "0" level. Since the 32 Hz signal is at "0" level, both the outputs from the AND circuit 54f and the OR circuit 54k are at "0" level.

Namely, only the analogue switch 55a is closed at this time, and the output of the electrode terminal COM1 is 0 V. (Refer to FIG. 2)

At the non-effective timing of the 32 Hz signal at "0" level, the output from the inverter 54a is at "1" level to operate the AND circuit 54i. This time both the outputs from the inverters 54c and 54b are at "1" level, and the output from the AND circuit 54i is also at "1" level. By this operation, only the analogue switch 55c is turned on and −3 V is present at the output of the electrode terminal COM1. (refer to FIG. 2)

At the effective timing of the 32 Hz signal at "1" level, the output from the AND circuit 54f is at "1" level and −4.5 V is present at the output of the electrode terminal COM1.

At the non-effective timing of the 32 Hz signal at "1" level, the output from the AND circuit 54h is at "1" level and −1.5 V is present at the output of the electrode terminal COM1. The normal multiplex drive waveforms have been illustrated so far.

When the logical testing of the watch logical circuit 51 is carried out, at least one switch of the test terminals 53 is turned on. The output from the OR circuit 52 thus becomes at "1" level and the output from the inverter 54c is at "0" level. Both the outputs from the AND circuits 54h and 54i are at "0" level to open both the analogue switches 55b and 55c in the test condition.

As a consequence, the voltage values −1.5 V and −3 V are never present at the output of the electrode terminal COM1.

The output from the AND circuit 54d is at "1" level at the effective timing of the 32 Hz signal at "0" level, and 0 V is present at the output of the electrode terminal COM1. (refer to FIG. 3)

The output from the AND circuit 54g is at "1" level at the non-effective timing of the 32 Hz signal at "0" level, and −4.5 V is present at the output of the electrode terminal COM1. (refer to FIG. 3)

At the timing of the 32 Hz signal at "1" level, 0 V is present at the effective timing.

Figure 4:
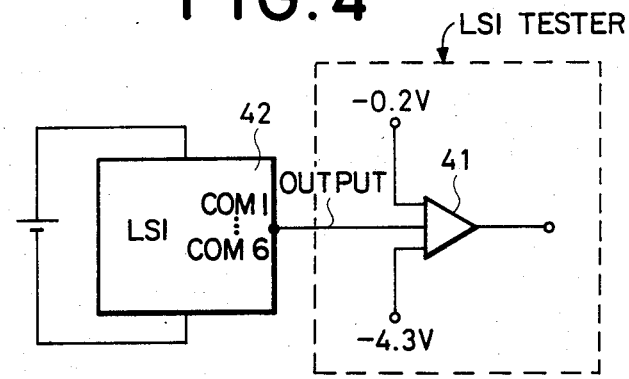
FIG. 4 is a schematic view of a conventional LSI tester.

As illustrated, the conventional LSI tester is constructed to produce only the two values (0 V and −4.5 V) of the voltage levels in the test condition in response to the outputs from the terminals COM1–COM6 of the circuit for detecting the test condition (the OR circuit 52 in the embodiment of FIG. 5), whereby the logical testing is easily carried out using the conventional LSI tester. In the manner shown in FIG. 4, the outputs from the terminals COM1–COM6 are applied to the LSI tester 41.

While only the common electrode terminal COM1 has been illustrated in FIG. 5, it is understood that a similar control should be carried out over the other terminals COM2–COM6 at which more than three voltage values are present. The control circuit and the like shown in FIG. 5 are integrated in one LSI.

The present invention enables a complicated multiplex drive LSI to be easily tested in a short time and reduces the cost of carrying out the test.

What I claim is:

1. An integrated circuit capable of producing a first signal of at least three voltage levels at an output terminal thereof for driving a liquid crystal during a normal mode of operation and capable of changing the first signal to a second signal of two voltage levels for use in testing the first signal during a test mode of operation, the integrated circuit comprising: a logic circuit for generating a reference signal and an effective signal to control the driving of a liquid crystal; testing means for producing a test signal during the test mode of operation; drive control circuit means for receiving said reference signal and said effective signal and operative to produce normal drive control signals in the absence of said test signal and operative to produce test drive control signals in response to said test signal; and analogue switch means responsive to the drive control signals for producing the said first signal of at least three voltage levels when said testing means does not produce said test signal and for producing the said second signal of two voltage levels when said testing means produces said test signal.

2. An integrated circuit as claimed in claim 1; wherein said logic circuit comprises a watch logic circuit.

* * * * *